United States Patent
Chen et al.

(10) Patent No.: US 8,767,493 B2
(45) Date of Patent: Jul. 1, 2014

(54) SRAM DIFFERENTIAL VOLTAGE SENSING APPARATUS

(75) Inventors: Yen-Huei Chen, Jhudong Township (TW); Kun-hsi Li, Hsin-Chu (TW); Shao-Yu Chou, Chu-Pei (TW); Hung-Jen Liao, Hsin-Chu (TW); Wei Min Chan, Sindian (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 105 days.

(21) Appl. No.: 13/169,511

(22) Filed: Jun. 27, 2011

(65) Prior Publication Data

US 2012/0327730 A1    Dec. 27, 2012

(51) Int. Cl.
*G11C 7/00* (2006.01)

(52) U.S. Cl.
USPC ....... 365/203; 365/201; 365/230.03; 365/207

(58) Field of Classification Search
USPC .............. 365/203, 201, 230.03, 207, 230.02
See application file for complete search history.

(56) References Cited

U.S. PATENT DOCUMENTS

| | | | | |
|---|---|---|---|---|
| 4,208,730 A * | 6/1980 | Dingwall et al. | ............ | 365/181 |
| 5,526,314 A * | 6/1996 | Kumar | ............ | 365/207 |
| 5,574,691 A * | 11/1996 | Tanida et al. | ............ | 365/201 |
| 5,742,615 A * | 4/1998 | Kondo et al. | ............ | 714/720 |
| 6,147,916 A * | 11/2000 | Ogura | ............ | 365/203 |
| 6,392,921 B1 * | 5/2002 | Kim et al. | ............ | 365/145 |
| 6,449,196 B2 * | 9/2002 | Fujimoto | ............ | 365/189.15 |
| 6,714,470 B2 * | 3/2004 | Leung et al. | ............ | 365/203 |
| 6,785,179 B1 * | 8/2004 | Bull et al. | ............ | 365/203 |
| 6,862,240 B2 * | 3/2005 | Burgan | ............ | 365/222 |
| 7,038,959 B2 * | 5/2006 | Garni | ............ | 365/203 |
| 7,363,555 B2 * | 4/2008 | Lee | ............ | 714/718 |
| 7,505,342 B2 * | 3/2009 | Lin et al. | ............ | 365/205 |
| 7,656,730 B2 * | 2/2010 | Akiyama | ............ | 365/201 |
| 7,656,731 B2 * | 2/2010 | Jung et al. | ............ | 365/203 |
| 8,130,541 B2 * | 3/2012 | Kim et al. | ............ | 365/163 |
| 8,144,537 B2 * | 3/2012 | Mishra et al. | ............ | 365/203 |
| 8,411,483 B2 * | 4/2013 | Lin et al. | ............ | 365/96 |

* cited by examiner

*Primary Examiner* — Pho M Luu
(74) *Attorney, Agent, or Firm* — Slater and Matsil, L.L.P.

(57) ABSTRACT

An SRAM differential voltage sensing apparatus is coupled to a memory circuit. The memory circuit comprises a memory bank, a plurality of bit lines, a plurality of data lines coupled to the plurality of bit lines via a plurality of transmission gates and a sense amplifier. When the sense amplifier operates in a characterization mode, the transmission gates and pre-charge circuits are turned off. The differential voltage sensing apparatus applies a characterization signal to the sense amplifier and obtains the parameters of the memory circuit through a trial and error process.

21 Claims, 5 Drawing Sheets

SRAM DIFFERENTIAL VOLTAGE SENSING APPARATUS

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them permanently unless an electrical charge is applied to non-volatile memories. Non-volatile memories include a variety of sub-categories, such as electrically erasable programmable read-only memory (EEPROM) and flash memory.

SRAM cells may comprise different numbers of transistors. According to the total number of transistors in an SRAM cell, the SRAM cell may be referred to as a six-transistor (6-T) SRAM, an eight-transistor (8-T) SRAM, and the like. SRAM cells are arranged in rows and columns. An SRAM cell is selected during either a READ operation or a WRITE operation by selecting its row and column. In a READ operation, both BL and $\overline{BL}$ of an SRAM cell are pre-charged to a voltage approximately equal to the operating voltage of the memory bank in which the SRAM cell is located. In response to a binary code from the row decoder, a word line coupled to the SRAM cell to be read is asserted so that the data latch is selected to proceed to a READ operation. During a READ operation, through a turned on pass-gate transistor, one bit line coupled to the storage node storing a logic "0" is discharged to a lower voltage. Meanwhile, the other bit line remains at the pre-charged voltage because there is no discharging path between the other bit line and the storage node storing a logic "1". The differential voltage between BL and $\overline{BL}$ (approximately in a range from 50 to 100 mV) is detected by a sense amplifier. Furthermore, the sense amplifier amplifies the differential voltage to a logic state level and reports the logic state of the memory cell via a data buffer.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a static random access memory (SRAM) differential voltage sensing apparatus. The invention may also be applied, however, to a variety of memory circuits.

Figure 1:
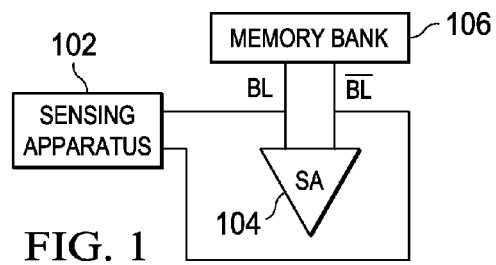
FIG. 1 illustrates a block diagram of an SRAM differential voltage sensing apparatus in accordance with an embodiment.

Referring initially to FIG. 1, a block diagram of an SRAM differential voltage sensing apparatus is illustrated in accordance with an embodiment. As illustrated in FIG. 1, an exemplary memory system may comprise a memory bank 106, a sense amplifier 104 and a differential voltage sensing apparatus 102. The memory bank 106 may comprise a plurality of memory cells arranged in rows and columns. The memory cells in a row of the memory bank 106 may be horizontally connected to a word line (not shown but illustrated in FIG. 2). Likewise, the memory cells in a column of the memory bank 106 may be vertically connected to a bit line (BL) and the inverse of BL ($\overline{BL}$).

The sense amplifier 104 has two inputs coupled to both the memory bank 106 and the differential voltage sensing apparatus 102. It should be noted that while FIG. 1 shows the differential voltage sensing apparatus 102 is connected in parallel with the memory bank 106, there may be a plurality of switches placed between the differential voltage sensing apparatus 102 and the sense amplifier 104. Likewise, there may be a plurality of switches (e.g., transmission gates) placed between the memory bank 106 and the sense amplifier 104. As a result, by activating different groups of switches, either the differential voltage sensing apparatus 102 or the memory bank 106 can be connected to the sense amplifier 104. More particularly, in normal operation, the switches between the differential voltage sensing apparatus 102 and the sense amplifier 104 are turned off. Therefore, the differential voltage sensing apparatus 102 has no impact on the normal operation of the memory bank 106. On the other hand, when the memory system operates in a characterization mode, the switches between the differential voltage sensing apparatus 102 and the sense amplifier 104 are turned on. The turned on switches allow the differential voltage sensing apparatus 102 to detect the voltages on the bit lines BL and $\overline{BL}$ so as to characterize of the memory system such as measuring an offset voltage of the sense amplifier 104.

A memory bank 106 may comprise a plurality of memory cells arranged in rows and columns. In order to read the logic state stored in a memory cell, a sense amplifier 104 amplifies the differential voltage and reports the logic state of the memory cell. More particularly, during a read operation, after receiving a decoded address, a word line driver (not shown) activates a corresponding word line (not shown but illustrated in FIG. 2). The activated word line selects a row of memory cells to be accessed by turning on the pass-gate transistors of each memory cell of the selected row. At the same time, in response to the decoded address, the transmission gates coupled to the column to be accessed are turned on. The turned-on transmission gates forward the differential voltage between the bit line BL and the bit line $\overline{BL}$ to the sense amplifier 104.

In accordance with an embodiment, the sense amplifier 104 may have an offset voltage in a range from −50 mV to 50 mV. As known in the art, a sense amplifier may not report a correct logic value when the input differential voltage is less than the offset voltage of the sense amplifier. Therefore, an offset voltage characterization test is necessary in order to design a robust sense amplifier. A differential voltage sensing apparatus 102 is employed to characterize the offset voltage of the sense amplifier 104. Furthermore, the differential voltage sensing apparatus 102 can also be used to estimate the data line differential voltage of the memory bank 106. The detailed operation of the differential voltage sensing apparatus 102 will be described below with respect to FIGS. 3-6.

Figure 2:
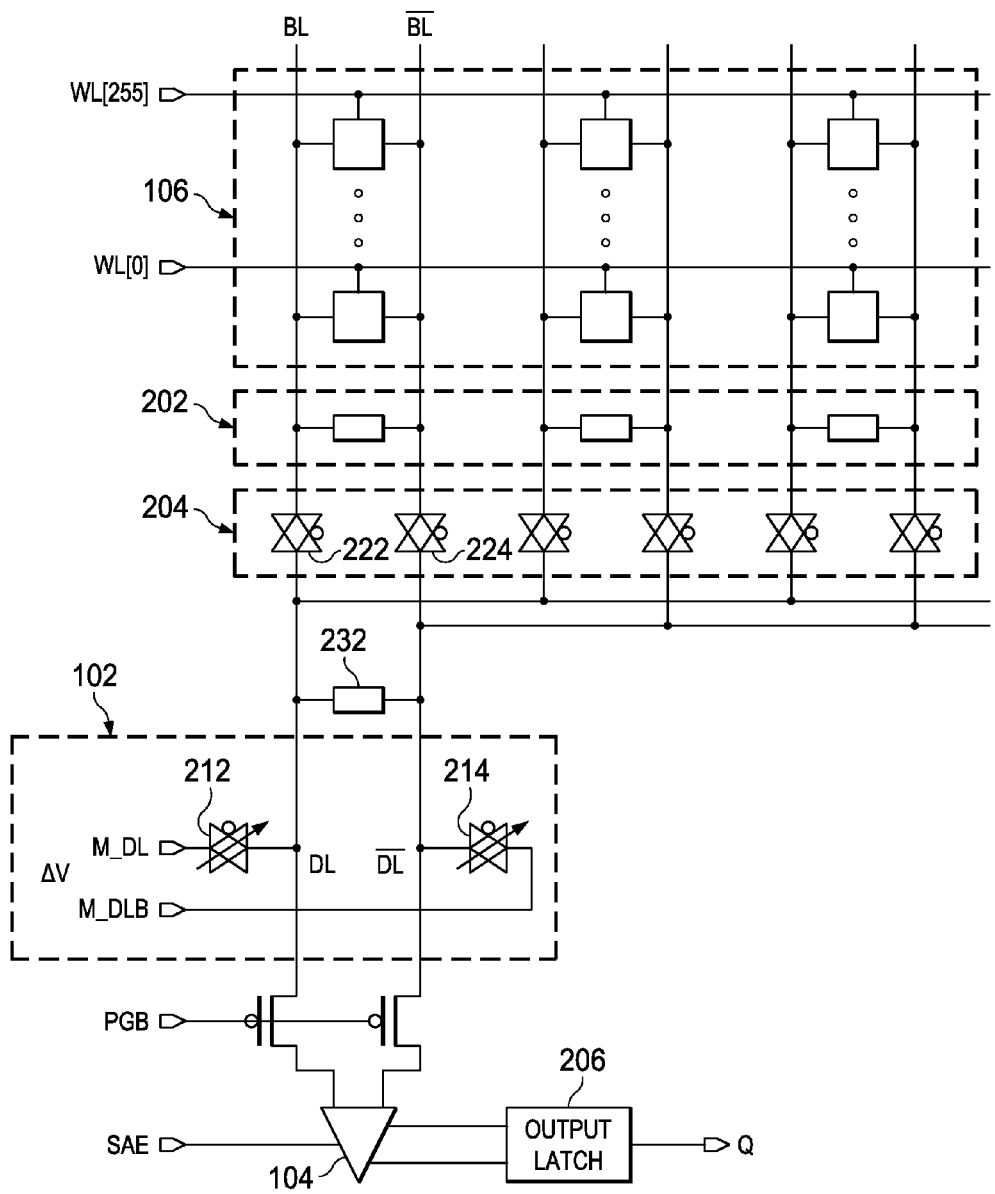
FIG. 2 illustrates in detail a schematic diagram of a memory system having a differential voltage sensing apparatus.

FIG. 2 illustrates in detail a schematic diagram of a memory system having a differential voltage sensing apparatus. In fact, FIG. 2 illustrates the system configuration of the memory system operating in a normal mode. More particularly, both a first transmission gate 212 and a second transmission gate 214 are turned off as indicated by the black arrows on top of the symbols of transmission gates 212 and 214. The transmission gate (e.g., transmission gate 212) functions as a switch. In response to the control signal applied to the transmission gate, the transmission gate may provide a channel allowing the signal to pass through and reach the input of the sense amplifier 104. On the other hand, the transmission gate may prevent the input of the sense amplifier 104 from receiving the signal. As shown in FIG. 2, the turned-off transmission gates 212 and 214 isolate the memory system from the differential voltage sensing apparatus 102. As a result, the differential voltage sensing apparatus 102 has no impact on the normal operation of the memory system.

In accordance with an embodiment, the memory bank 106 may comprise a plurality of memory cells arranged in rows and columns. As known in the art, each memory cell may comprise two access switches whose gates are coupled to a word line (e.g., word line WL[255]). Furthermore, in a read or write operation, the memory cells arranged in one row are controlled by a same word line. More particularly, according to the result of decoding of a read or write control signal, a word line is set to high when the row of memory cells coupled to the word line will be accessed. The logic high state at the word line turns on each memory cell's access switches of the memory row to which the word line is coupled. As a result, a read or write operation can be performed through the turned on access switches.

The bit lines BL and $\overline{BL}$ of the memory bank 106 are coupled to the sense amplifier 104 through the corresponding transmission gates (e.g., transmission gates 222 and 224). After passing the transmission gates 204, the signals on the bit lines BL and $\overline{BL}$ are commonly referred to as data lines DL and $\overline{DL}$ respectively. During a read operation, depending on the stored data on storage nodes of a memory cell, either the data line DL or the data line $\overline{DL}$ is discharged to a lower voltage level. The differential voltage between the data line DL and the data line $\overline{DL}$ is converted into a logic-level output by the sense amplifier 104. Furthermore, the sense amplifier 104 reports the logic level through an output latch 206.

Figure 3:
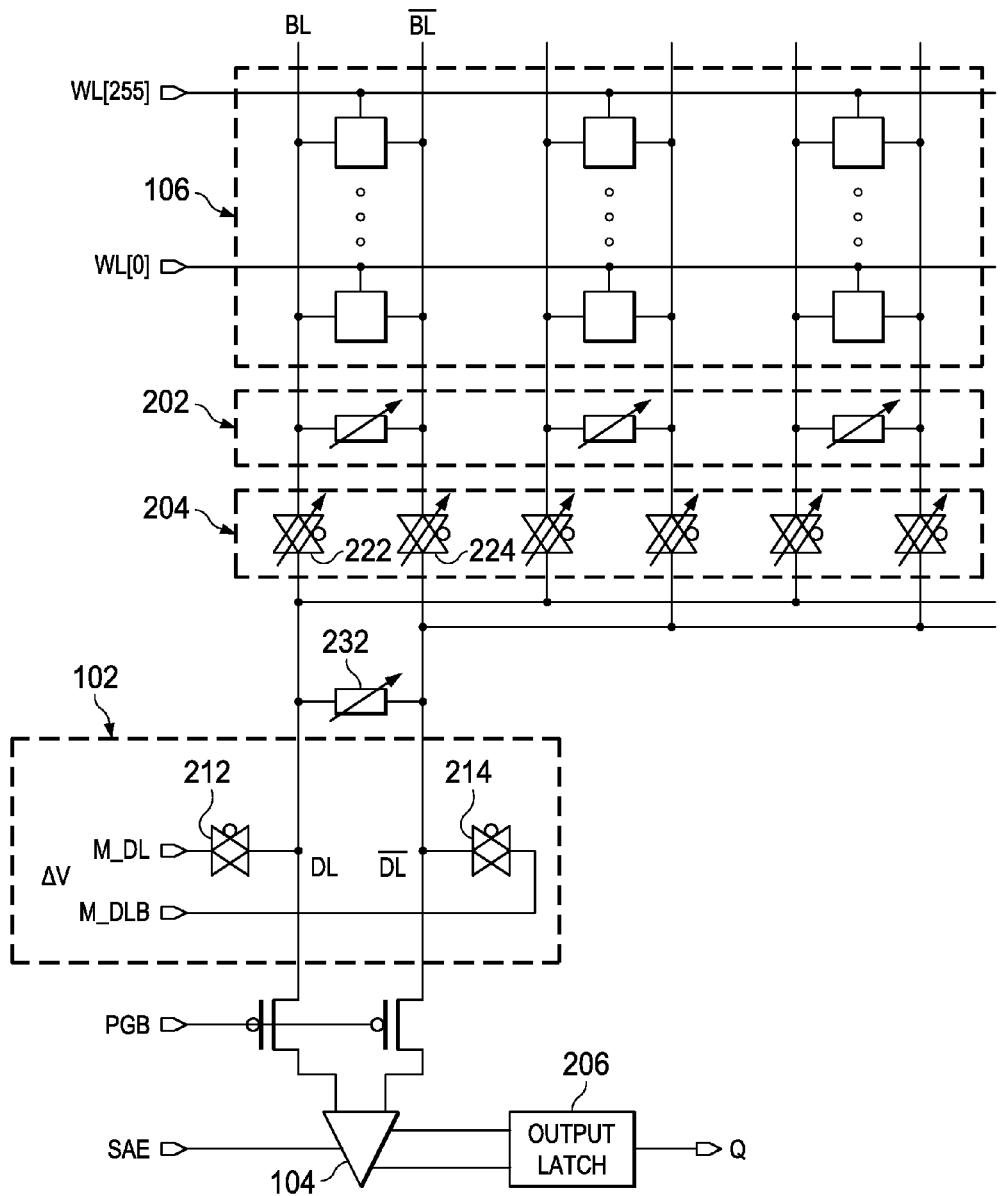
FIG. 3 illustrates a schematic diagram of the memory system shown in FIG. 2 operating in an offset voltage characterization mode.

FIG. 3 illustrates a schematic diagram of the memory system shown in FIG. 2 operating in an offset voltage characterization mode. The components of FIG. 3 are similar to those of FIG. 2, and hence are not discussed in detail to avoid repetition. As shown in FIG. 3, during an offset voltage characterization mode, the transmission gates 204, the bit line pre-charge circuits 202 and the data line pre-charge circuit 232 are turned off as indicated by the black arrows drawn on top of each component's symbol. As a result, the memory bank 106 and its auxiliary circuits (e.g., pre-charge circuit 202) are isolated from the inputs of the sense amplifier 104, and hence have no impact on the characterization of the offset voltage of the sense amplifier 104.

During an offset voltage characterization test, an external test setup such as a tester (not shown) is connected to M_DL and M_DLB. In order to perform the offset voltage characterization test, both the transmission gate 212 and the transmission gate 214 are turned on so that the characterization signals from the tester can be applied to the inputs of the sense amplifier 104. In accordance with an embodiment, the tester may support 2 mV test accuracy. The characterization test may start from a small voltage such as 2 mV. In other words, a 2 mV characterization signal is applied to the inputs of the sense amplifier 104 through the transmission gates 212 and 214. In accordance with the operation principle of amplifiers, the sense amplifier 104 may remain at the initial logic level until the characterization signal is greater than the offset voltage of the sense amplifier 104. In order to retrieve the offset voltage of the sense amplifier 104, the differential voltage sensing apparatus 102 repeats a trial and error process until the sense amplifier 104 reports a logic level change. The detailed operation will be discussed with respect to FIG. 4.

Figure 4:
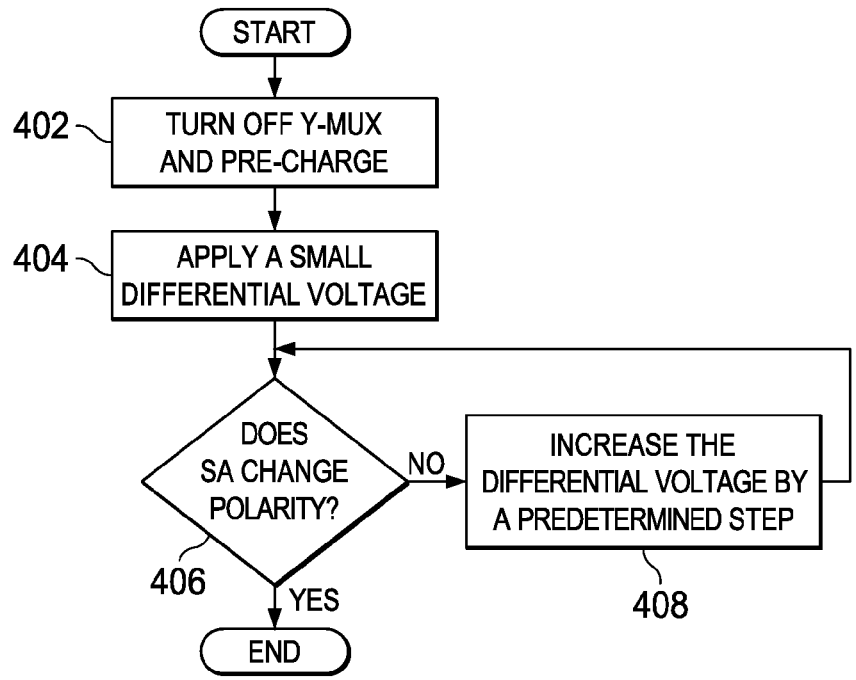
FIG. 4 illustrates a flow diagram of characterizing the offset voltage of a sense amplifier in accordance with an embodiment.

FIG. 4 illustrates a flow diagram of characterizing the offset voltage of a sense amplifier in accordance with an embodiment. At step 402, all transmission gates connected between the memory bank 106 and the sense amplifier 104 are turned off. It should be noted that the transmission gates are commonly referred to as Y-MUX. In order to isolate the sense amplifier 104 from other potential interference sources, the bit line pre-charge circuits 202 and the data line pre-charge circuit 232 are turned off too at step 402. At step 404, an external test setup such as a tester applies a small differential voltage to the inputs of the sense amplifier 104. At step 406, if the sense amplifier 104 reports a logic level change, then the differential voltage sensing apparatus 102 finishes the characterization test and reports the small differential voltage as the offset voltage of the sense amplifier 104.

On the other hand, if the sense amplifier 104 remains at its initial logic level, then the differential voltage sensing apparatus 102 executes step 408. At step 408, the differential voltage sensing apparatus 102 increases the characterization signal's voltage by a predetermined step (e.g., 2 mV). Subsequently, the differential voltage sensing apparatus 102 applies the newly increased characterization signal to the sense amplifier 104 and repeats step 406 again until the sense amplifier 104 changes its output polarity. An advantageous feature of having the differential voltage sensing apparatus 102 is that the characterization accuracy can be achieved by employing a high resolution external tester.

Figure 5:
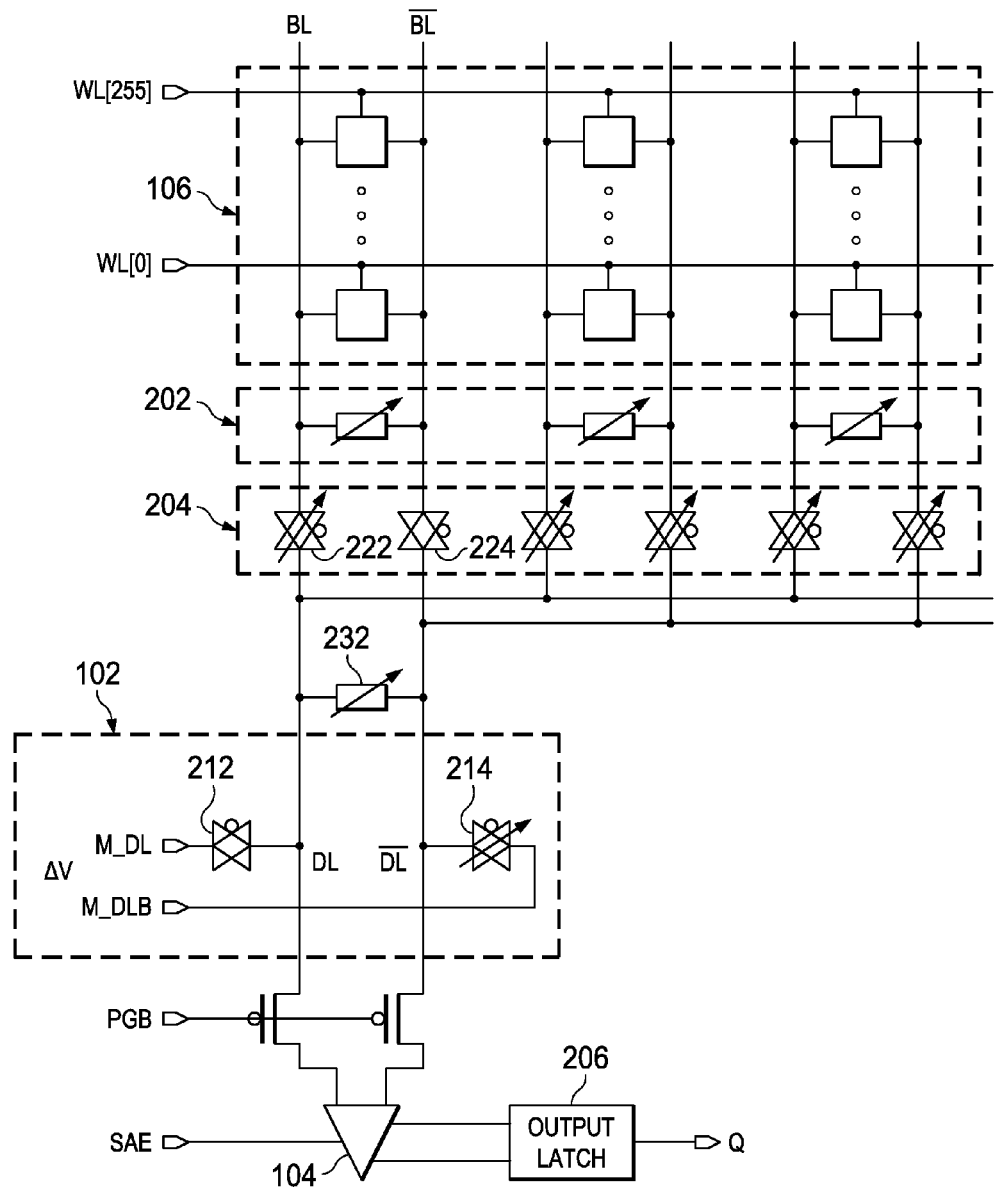
FIG. 5 illustrates a schematic diagram of the memory system shown in FIG. 2 operating in a data line differential voltage characterization mode.

FIG. 5 illustrates a schematic diagram of the memory system shown in FIG. 2 operating in a data line differential voltage characterization mode. The components of FIG. 5 are similar to those of FIG. 2, and hence are not discussed in detail to avoid repetition. As shown in FIG. 5, during a data line differential voltage characterization mode, the transmission gates 204 except transmission gate 224, the bit line pre-charge circuits 202 and the data line pre-charge circuit 232 are turned off as indicated by the black arrows drawn on top of each line component's symbol. As a result, except the bit line $\overline{BL}$ of the memory bank 106, the rest of the memory bank 106 and its auxiliary circuits (e.g., pre-charge circuit 202) are isolated from the inputs of the sense amplifier 104, and hence have no impact on the characterization of the data line differential voltage.

During a data line differential voltage characterization test, an external test setup such as a tester is connected to M_DL. In order to perform the data line differential voltage characterization test, the transmission gate 212 is turned on so that the characterization signal from the tester can be applied to one input of the sense amplifier 104. On the other hand, the line memory cells coupled to the bit line $\overline{BL}$ perform a read "0" operation. The logic "0" stored at the memory cells discharges the bit line $\overline{BL}$. Through the turned-on transmission gate 224, the line discharged bit line $\overline{BL}$ is applied to the other input of the sense amplifier 104. It should be noted that while FIG. 5 illustrates a schematic diagram of characterizing a data line differential line voltage through a read "0" operation at the bit line $\overline{BL}$, the schematic diagram shown in FIG. 5 is merely an exemplary approach and is not meant to limit the current embodiments. A person having ordinary skill in the art will recognize that in alternative embodiments, the characterization of the data line differential voltage can be performed by a similar read "0" operation at the bit line BL.

In accordance with an embodiment, the tester may support 2 mV test accuracy. The characterization test may start from a voltage equal to the operating voltage of the memory bank 106. In other words, a characterization signal equivalent to the pre-charged voltage of the bit lines BL and $\overline{BL}$ is applied to one input of the sense amplifier 104 through the transmission gate line 212. The other input of the sense amplifier 104 is connected to the bit line $\overline{BL}$, which is discharged to a lower voltage level during a read "0" operation. In order to calculate the data line differential voltage, the differential voltage sensing apparatus 102 reduces the characterization signal's voltage by a predetermined step until the sense amplifier 104 fails to maintain the logic state at its output. The detailed operation will be discussed with respect to FIGS. 6 and 7.

Figure 6:
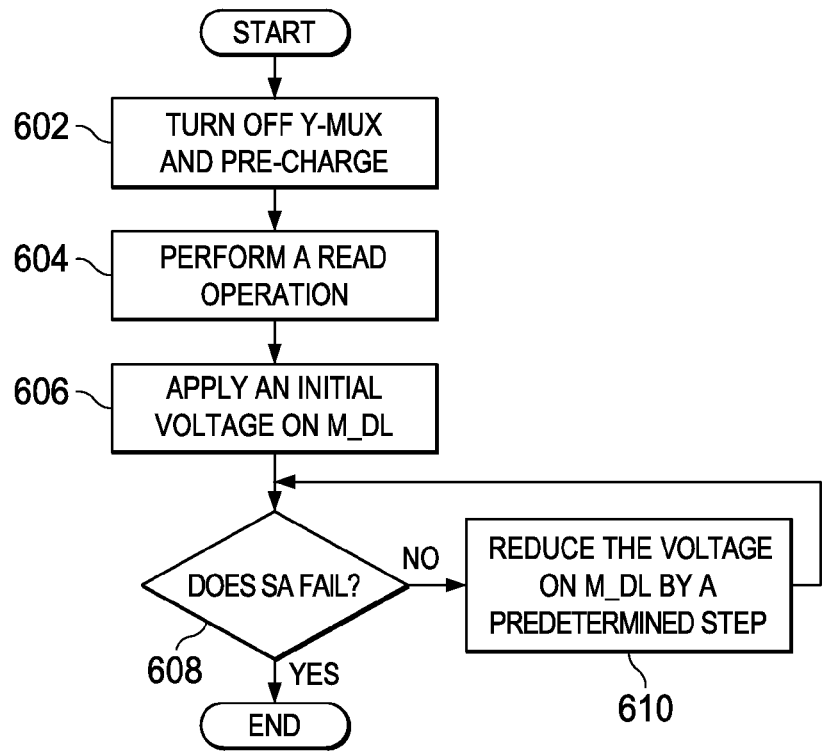
FIG. 6 illustrates a flow diagram of a data line differential voltage characterization test in accordance with an embodiment.

FIG. 6 illustrates a flow diagram of a data line differential voltage characterization test in accordance with an embodiment. At step 602, all transmission gates except the transmission gate 224 connected between the memory bank 106 and the sense amplifier 104 are turned off. In order to isolate the sense amplifier 104 from other potential interference sources, the bit line pre-charge circuits 202 and the data line pre-charge circuit 232 are turned off too at step 602. At step 604, the memory system performs a read "0" operation at a memory cell coupled to the bit line $\overline{BL}$. At step 606, an initial characterization voltage equal to the operating line voltage of the memory system is applied to M_DL. At step 608, if the sense amplifier 104 fails to maintain its logic state, then the differential voltage sensing apparatus 102 finishes the characterization test.

On the other hand, if the sense amplifier 104 remains at its initial logic level, then the differential voltage sensing apparatus 102 executes step 610. At step 610, the differential voltage sensing apparatus 102 reduces the characterization signal's voltage by a predetermined step (e.g., 2 mV). Subsequently, the differential voltage sensing apparatus 102 applies the newly reduced characterization signal to the sense amplifier 104 and repeats step 608 again until the sense amplifier 104 fails to maintain its logic state. Based upon the last characterization voltage applied to M_DL, the differential voltage sensing apparatus 102 can report the differential voltage between DL and DLB. The detailed operation will be described below with respect to FIG. 7.

Figure 7:
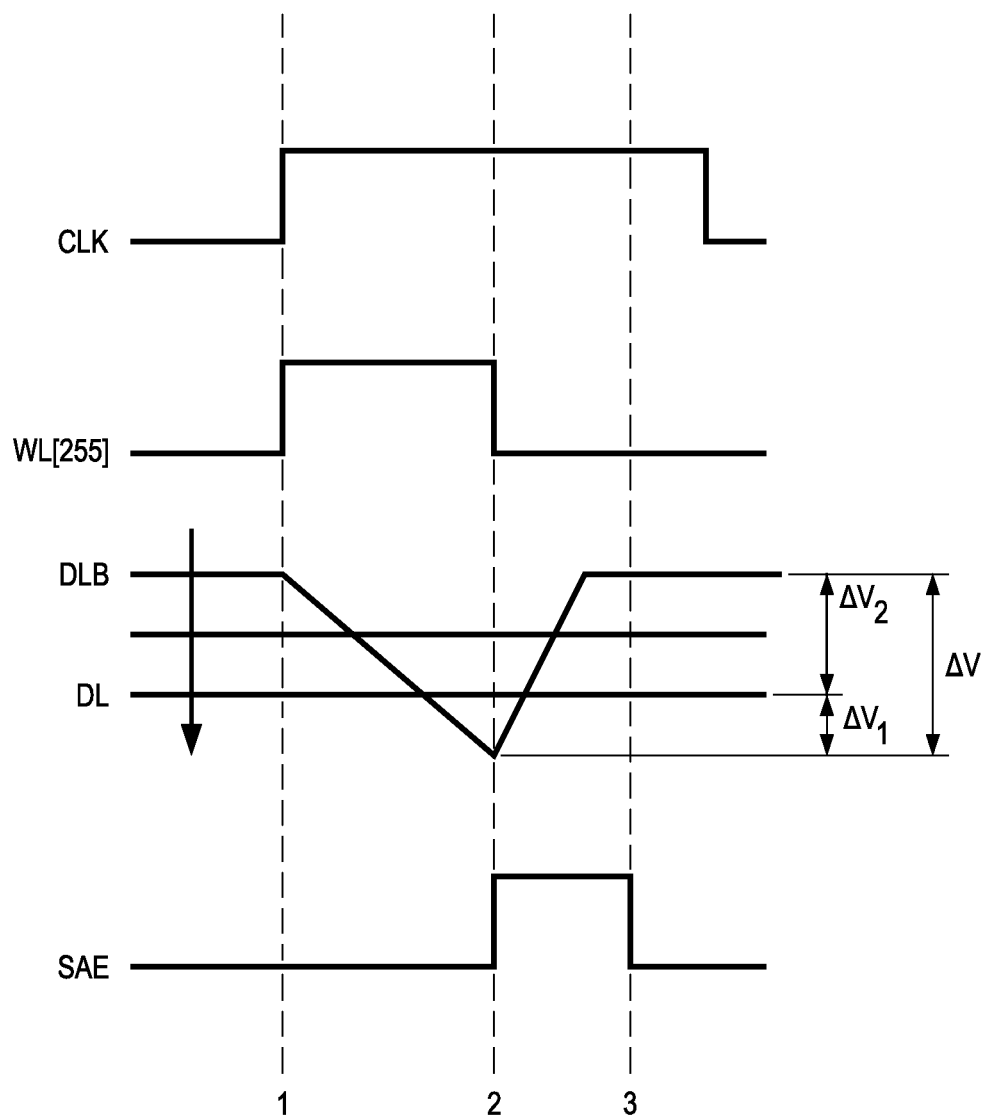
FIG. 7 illustrates a timing diagram that shows a data line differential voltage characterization test in accordance with an embodiment.

FIG. 7 illustrates a timing diagram that shows a data line differential voltage characterization test in accordance with an embodiment. At the first time instance (labeled by dashed line 1), when the leading edge of a read clock signal arrives, the word line WL is selected by the word line driver (not shown) and rises from a low voltage to a high voltage. Such a high voltage of the word line WL is able to turn on the pass-gate transistors of the memory cell to be line read. The bit line $\overline{BL}$ starts to drop because it is a read "0" operation and the logic low stored at line the storage node discharges the bit line $\overline{BL}$ via the turned-on pass-gate transistor. As a line consequence, the data line DL is discharged following the same trajectory as the bit line $\overline{BL}$ line because the turned on transmission gate 224 directly connects the bit line $\overline{BL}$ with the data line. As shown in FIG. 7, the voltage of the data line $\overline{DL}$ continues being discharged until the second time instance (labeled by dashed line 2).

At the second time instance, the sense amplifier 104 is enabled by the enable signal SAE. As soon as the sense amplifier 104 is enabled, the differential voltage sensing apparatus 102 starts to reduce the voltage (DL) applied to one input of the sense amplifier 104. At the same time, the differential voltage sensing apparatus 102 continues monitoring the logic state at the output of the sense amplifier 104. If the sense amplifier 104 remains at its initial logic level, then the differential voltage sensing apparatus 102 reduces the characterization signal's voltage (DL) by a predetermined step (e.g., 2 mV). Subsequently, the differential voltage sensing apparatus 102 repeats this trial and error process again until the sense amplifier 104 fails to maintain its logic state. Based upon the last characterization voltage applied to M_DL, the differential voltage sensing apparatus 102 can report the differential voltage between the data line DL and the data line $\overline{DL}$.

As shown in FIG. 7, $\Delta V_1$ is the offset voltage of the sense amplifier 104, which can be obtained through the characterization process described above with respect to FIGS. 3 and 4. $\Delta V_2$ is reported by the differential voltage sensing apparatus 102. More particularly, the differential voltage sensing apparatus 102 calculates the voltage difference between its initial characterization voltage and the last voltage before the sense amplifier 104 fails to maintain its logic state. In other words, the voltage difference calculated by the differential voltage sensing apparatus 102 is $\Delta V_2$. As such, the differential voltage between the data line DL and the data line $\overline{DL}$ can be defined as:

$$\Delta V = \Delta V_1 + \Delta V_2$$

Where $\Delta V$ is the differential voltage between the data line DL and the data line $\overline{DL}$.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a first switch coupled to a first data line of a memory bank;
   a second switch coupled to a second data line of the memory bank; and
   a test setup coupled to a sense amplifier through the first switch and the second switch, wherein the test setup is coupled to the first data line through the first switch and coupled to the second data line through the second switch.

2. The apparatus of claim 1, wherein the first switch is a transmission gate and the second switch is a transmission gate.

3. The apparatus of claim 1, wherein the first switch and the second switch are turned off when a memory circuit coupled to the sense amplifier operates in a normal mode.

4. The apparatus of claim 1, wherein the test setup is configured to apply a characterization signal to inputs of the sense amplifier when the sense amplifier operates in a characterization mode.

5. The apparatus of claim 1, wherein the test setup is configured to monitor an output of the sense amplifier such that:
   the test setup reduces a characterization signal's voltage by a predetermined step when the sense amplifier maintains an initial logic state; and
   the test setup reports a last characterization signal's voltage when the sense amplifier fails to maintain the initial logic state.

6. The apparatus of claim 1, wherein the test setup is configured to monitor an output of the sense amplifier such that:
   the test setup increases a characterization signal's voltage by a predetermined step when the sense amplifier maintains an initial logic state; and
   the test setup reports a last characterization signal's voltage when the sense amplifier fails to maintain the initial logic state.

7. A system comprising:
   a memory bank having a plurality of memory cells arranged in rows and columns;
   a plurality of bit lines coupled to the memory cells vertically;
   a plurality of data lines coupled to the plurality of bit lines via a plurality of transmission gates; and
   a differential voltage sensing apparatus comprising:
      a first switch coupled to a first data line of the memory bank;
      a second switch coupled to a second data line of the memory bank; and
      a test setup coupled to a sense amplifier through the first switch and the second switch, wherein the test setup is coupled to the first data line through the first switch and coupled to the second data line through the second switch.

8. The system of claim 7, further comprising a plurality of bit line pre-charge circuits coupled in parallel with respective bit lines of a column of memory cells, wherein the bit line pre-charge circuits are turned off when the sense amplifier operates in a characterization mode.

9. The system of claim 7, further comprising a data line pre-charge circuit coupled between inputs of the sense amplifier, wherein the data line pre-charge circuit is turned off when the sense amplifier operates in a characterization mode.

10. The system of claim 7, wherein the plurality of transmission gates are turned off when the sense amplifier operates in an offset voltage characterization mode.

11. The system of claim 7, wherein the plurality of transmission gates, except that a selected transmission gate is turned on, are turned off when the sense amplifier operates in a data line differential voltage characterization mode.

12. The system of claim 7, further comprising an output latch coupled to the sense amplifier, wherein the output latch reports a logic state of the sense amplifier.

13. The system of claim 7, further comprising a read "0" operation on a bit line, wherein the bit line is coupled to a first input of the sense amplifier and a characterization signal from the differential voltage sensing apparatus is applied to a second input of the sense amplifier.

14. The system of claim 7, wherein the first switch and second switch are a transmission gate.

15. A method comprising:
   turning off a plurality of transmission gates coupled between a memory bank and a sense amplifier;
   turning on a first switch coupled between a differential voltage sensing apparatus and a first input of the sense amplifier, wherein the differential voltage sensing apparatus is coupled to the memory bank through the first switch;
   applying a characterization signal to the sense amplifier; and
   adding a voltage step on the characterization signal until the sense amplifier reports a logic state change.

16. The method of claim 15, further comprising:
   sensing an offset voltage of the sense amplifier; and
   characterizing a data line differential voltage of the memory bank.

17. The method of claim 15, further comprising turning off a data line pre-charge circuit coupled between inputs of the sense amplifier.

18. The method of claim 15, further comprising turning off a plurality of bit line pre-charge circuits coupled between bit lines of the memory bank.

19. The method of claim 15, further comprising:
   performing a read "0" operation on a bit line;
   turning on a transmission gate coupled between the bit line and a first input of the sense amplifier;
   applying a characterization signal to a second input of the sense amplifier; and
   reducing the characterization signal by a predetermined step until the sense amplifier fails to maintain an initial logic state.

20. The method of claim 15, further comprising:
   turning on a second switch coupled between a differential voltage sensing apparatus and a second input of the sense amplifier;
   applying a characterization signal to inputs of the sense amplifier; and
   increasing the characterization signal by a predetermined step until the sense amplifier fails to maintain an initial logic state.

21. The method of claim 15, further comprising:
   reporting a logic state of the sense amplifier via an output latch.

* * * * *